United States Patent
Cemic et al.

(10) Patent No.: US 7,209,243 B2
(45) Date of Patent: Apr. 24, 2007

(54) ILLUMINATION DEVICE, AND COORDINATE MEASURING INSTRUMENT HAVING AN ILLUMINATION DEVICE

(75) Inventors: Franz Cemic, Weilmuenster (DE); Lambert Danner, Wetzlar-Naunheim (DE); Gerhard Hoppen, Wetzlar (DE)

(73) Assignee: Leica Microsystems Semiconductor GmbH, Wetzlar (DE)

( * ) Notice: Subject to any disclaimer, the term of this patent is extended or adjusted under 35 U.S.C. 154(b) by 0 days.

(21) Appl. No.: 10/776,256

(22) Filed: Feb. 12, 2004

(65) Prior Publication Data

US 2004/0160777 A1 Aug. 19, 2004

Related U.S. Application Data

(62) Division of application No. 09/893,998, filed on Jun. 29, 2001.

(30) Foreign Application Priority Data

Jun. 29, 2000 (DE) ................................. 100 31 719

(51) Int. Cl.
*G01B 11/14* (2006.01)

(52) U.S. Cl. ...................... 356/620; 356/400; 356/401; 362/554

(58) Field of Classification Search ................ 356/614, 356/615, 616, 622, 399, 400, 401; 359/454, 359/455; 362/551, 554, 558
See application file for complete search history.

(56) References Cited

U.S. PATENT DOCUMENTS

| 4,505,555 A | 3/1985 | Piller et al. .................. 359/388 |
| 4,721,359 A | 1/1988 | Nishioka et al. ............ 385/117 |
| 4,964,692 A * | 10/1990 | Prescott ...................... 385/117 |

(Continued)

FOREIGN PATENT DOCUMENTS

DE 1913711 10/1969

(Continued)

OTHER PUBLICATIONS

F. L. Pedrotti, L. S. Pedrotti, 'Introduction to Optics', Prentice Hall, New Jersey, 1993, pp. 135-139.*

(Continued)

*Primary Examiner*—Arnel Lavarias
(74) *Attorney, Agent, or Firm*—Crowell & Moring LLP

(57) ABSTRACT

A coordinate measuring instrument includes a horizontally X-Y displaceable measurement stage for receiving a substrate with a feature that is to be measured, an illumination system, and a detector device. The illumination system includes a light source, an optical fiber bundle, a coupling-in optical system before the optical fiber bundle, a coupling-out optical system after the optical fiber bundle, an illuminating optical system for illuminating an image field, and a homogenizing optical system which is arranged between said coupling-out optical system and said illuminating optical system. The homogenizing optical system homogenizes the non-uniform intensity distribution in the image field of the light emerging from the optical fiber bundle. The light of said light source is picked off via said coupling-in optical system with a large numerical entrance aperture, and is coupled into said optical fiber bundle. The detector device determines the values of X and Y coordinates of the feature within the X-Y displaceable measurement stage.

6 Claims, 5 Drawing Sheets

U.S. PATENT DOCUMENTS

| | | | |
|---|---|---|---|
| 5,608,575 A * | 3/1997 | Suzuki | 359/558 |
| 5,907,395 A | 5/1999 | Schulz et al. | 356/139.03 |
| 6,064,477 A * | 5/2000 | Matsumoto et al. | 356/237.2 |
| 6,285,855 B1 * | 9/2001 | Tsuji | 359/618 |
| 6,456,377 B1 | 9/2002 | Suzuki et al. | 356/399 |
| 2003/0002296 A1 * | 1/2003 | Steiner et al. | 362/560 |

FOREIGN PATENT DOCUMENTS

| | | |
|---|---|---|
| DE | 3624687 A1 | 5/1987 |
| EP | 0905439 A2 | 3/1999 |
| JP | 04196280 A | 7/1992 |
| JP | 06029189 A * | 2/1994 |
| WO | WO 97/03346 | 1/1997 |
| WO | WO 98/07001 | 2/1998 |
| WO | WO 99/53269 | 10/1999 |
| WO | WO-9963384 A1 | 12/1999 |

OTHER PUBLICATIONS

European Search Report dated Jan. 12, 2004.
International Search Report dated Mar. 3, 2004.

* cited by examiner

ILLUMINATION DEVICE, AND COORDINATE MEASURING INSTRUMENT HAVING AN ILLUMINATION DEVICE

CROSS REFERENCE TO RELATED APPLICATIONS

This application is a division of application Ser. No. 09/893,998, filed Jun. 29, 2001.

This invention claims priority of a German patent application DE 100 31 719.7 which is incorporated by reference herein.

FIELD OF THE INVENTION

The invention concerns an illumination device having the features of the preamble of independent Claim 1. The invention further concerns a coordinate measuring instrument having an illumination device, having the features of the preamble of independent Claim 5. The dependent claims recite advantageous embodiments.

BACKGROUND OF THE INVENTION

In the production of semiconductor chips, as packing density continually increases the widths of the individual features become ever smaller. Corresponding to these smaller and smaller structures, requirements are becoming more stringent in terms of the specifications of coordinate measuring instruments that are used as measurement and inspection systems for measuring feature edges and feature positions, and for measuring feature widths. Optical sensing methods are still favored for these coordinate measuring instruments, even though feature widths are already smaller than the light wavelength used for measurement and inspection. The reason is that measurement systems with optical sensing methods are substantially easier to use than systems with other sensing methods, for example using electron beams.

Because the features being measured are becoming smaller and smaller, however, the requirements in terms of optical system performance, especially resolving power, become more stringent. For example, to allow optically reproducible measurement of feature widths, edge profiles, or the like, the measurement fields must be illuminated as homogeneously as possible.

Illumination devices that operate with an optical waveguide to generate a homogeneous illumination field are known. One such illumination device is used, for example, in the Leica® LMS IPRO coordinate measurement instrument of Leica Microsystems AG.

In this illumination device, the light of a light source is picked off via a coupling-in optical system with a small numerical aperture (e.g. NA=0.18) and coupled into a multimode optical waveguide. The light source used is a 100 W Hg—Xe discharge lamp. The multimode optical waveguide possesses a small core diameter of 0.4 mm and a nominal numerical aperture NA=0.21. The specimen is then Köhler-illuminated in known fashion via a coupling-out optical system, using a tube lens and a PLAN-APO 50X objective. An image field with a diameter of 0.056 mm is illuminated with this illumination device. To achieve uniform illumination with inhomogeneities of approximately a few percent in this context, only a small numerical aperture NA=0.12 is picked off by the multimode fiber. This corresponds to a semiangle of approx. 7°. As a result, only that region of the fiber's emission characteristic curve in which the intensity of the light varies by only a few percent as a function of emission angle is used.

The known illumination device has the advantage that the light source, which at the same time is a strong heat source, can be arranged well outside the actual measurement location and at a great distance from the specimen being measured. Temperature influences on the measurement accuracy of the coordinate measuring instrument are thereby minimized. At the same time, the illuminating light is conveyed via the flexible optical waveguide to any desired measurement location.

The disadvantage of the known illuminating device is that because of the emission characteristic curve of multimode fibers, the angular region in which the intensity of the emitted light varies only on the order of a few percent is very narrow. If larger fields nevertheless need to be homogeneously illuminated, the fiber diameter must be correspondingly large. The rigidity of optical fibers rises sharply with increasing diameter. For future coordinate measuring instruments, for example, a homogeneously illuminated image field of 0.35 mm is necessary. This would require the use of an optical fiber having a core diameter greater than 1 mm in order to achieve sufficient homogeneity in the image field. Fibers with a core diameter greater than 1 mm are, however, no longer practically usable because of their rigidity.

SUMMARY OF THE INVENTION

It is therefore the object of the present invention to describe an illumination device for a coordinate measuring instrument for homogeneous illumination of a much larger image field than hitherto possible, in which simultaneously only a minor light loss is to occur. Brightness differences in the illuminated image field are also intended to be very small.

This object is achieved by an illumination device having a light source, an optical waveguide, a coupling-in optical system which couples the light of the light source into a first end of the optical waveguide, a coupling-out optical system which couples out the light emerging from a second end of the optical waveguide, and an illuminating optical system which receives the light emerging from the coupling-out optical system and illuminates an image field; in which, according to the present invention:

a) an optical fiber bundle is arranged as the optical waveguide; and in which b) there is arranged between the coupling-out optical system and the illuminating optical system a homogenizing optical system which homogenizes the nonuniform intensity distribution in the image field of the light emerging from the optical fiber bundle (4).

Advantageous embodiments of the invention are the subject matter of the dependent claims.

The illumination device according to the present invention in turn uses an optical waveguide. The light of a light source is picked off via an enlarging coupling-in optical system with the largest possible numerical entrance aperture (e.g. NA=0.60) and coupled into the optical waveguide. This already constitutes a difference from the known illumination device, in which the light of the light source was picked off and coupled into the optical waveguide via a coupling-in optical system with a small aperture. Since the largest possible angle of the brightest portion of the lamp is picked off in the illumination device according to the present invention, a definite gain in intensity is achieved.

But in order to eliminate the need to use an optical fiber, i.e. an optical waveguide, having a large core diameter, a fiber bundle is used instead. According to the present invention, the light emitted from the fiber bundle, which usually has an unsatisfactory intensity distribution, is transformed with a homogenizing optical system into a so-called "flat-top" (or "super-Gaussian") distribution.

Refractive lens arrays, holographic optical elements (HOEs), diffractive optical elements (DOEs), honeycomb condensers, or combinations of lens arrays and diffusion disks can be used as homogenizing optical systems.

The optimum solution for the homogenizing optical system has proven, however, to be a successive arrangement of a micro-honeycomb condenser and a lens member. The micro-honeycomb condenser comprises two quartz plates cemented to one another, each of which has on the external surfaces a dense array of planoconvex microlenses, the two external surfaces being reciprocally located in the focal plane of the microlenses on the respective opposite external surface. Homogeneity approaches an optimum as the number of transilluminated microlenses increases. This optimum homogeneity of the brightness in the image field is not appreciably improved by any further increase in the number of microlenses.

A further object of the invention is to describe a coordinate measuring instrument having an illumination device for homogeneous illumination of a much larger image field than heretofore possible; at the same time, only a small light loss is to occur. The brightness differences in the illuminated image field are intended to be very small.

This object is achieved by a coordinate measuring instrument having a horizontally X-Y displaceable measurement stage for receiving a substrate with a feature that is to be measured; having an illumination system with a light source, an optical waveguide, a coupling-in optical system before the optical waveguide, a coupling-out optical system after the optical waveguide, and an illuminating optical system for illuminating an image field; and having a detector device for determining the position of the feature, in which, according to the present invention, a) an optical fiber bundle is arranged as the optical waveguide; and in which
b) there is arranged between the coupling-out optical system and the illuminating optical system a homogenizing optical system which homogenizes the nonuniform intensity distribution in the image field of the light emerging from the optical fiber bundle.

Advantageous embodiments of the invention are the subject matter of the dependent claims.

Since the intensity distribution of the light emitted from the light guide has, to a good approximation, no further influence on the intensity profile in the image field because of the use according to the present invention of a homogenizing optical system, it is also possible to use, instead of one individual fiber with a large core diameter, a fiber bundle comprising many individual fibers. This type of light guide has low rigidity even when its diameter is large. In the case of individual fibers, the emission characteristic curve is strongly dependent on the curvature state of the fiber, which requires more alignment effort. Fiber bundles, on the other hand, are much less sensitive in terms of curvature. The light balance (i.e. the quotient of the total intensity in the image field and the intensity of the light emitted by the fiber) is comparatively most favorable in the context of homogenization by means of a lens array.

With an illumination device according to the present invention, a homogeneously illuminated image field with a minimum diameter of 0.35 mm is achieved at a numerical aperture of 0.60. The illumination inhomogeneity is less than ±2% of the average between the maximum intensity and minimum intensity.

The homogeneously illuminated image field is thus equally large in a coordinate measuring instrument according to the present invention with which features of semiconductor industry lithography masks can be measured. As a result, for example, it is no longer necessary to refocus in response to changes in the position of feature planes that occur because of production-related mask thickness tolerances. Here again, the illumination inhomogeneity is less than ±2% of the average between the maximum intensity and minimum intensity. This yields a definite improvement in measurement accuracy, in particular with large masks.

BRIEF DESCRIPTION OF THE DRAWINGS

The invention will be explained in more detail with reference to several exemplary embodiments, with the aid of the schematic drawings in which.

In the Figures, similar elements are labeled with the same reference numbers.

DETAILED DESCRIPTION OF THE INVENTION

Figure 1:
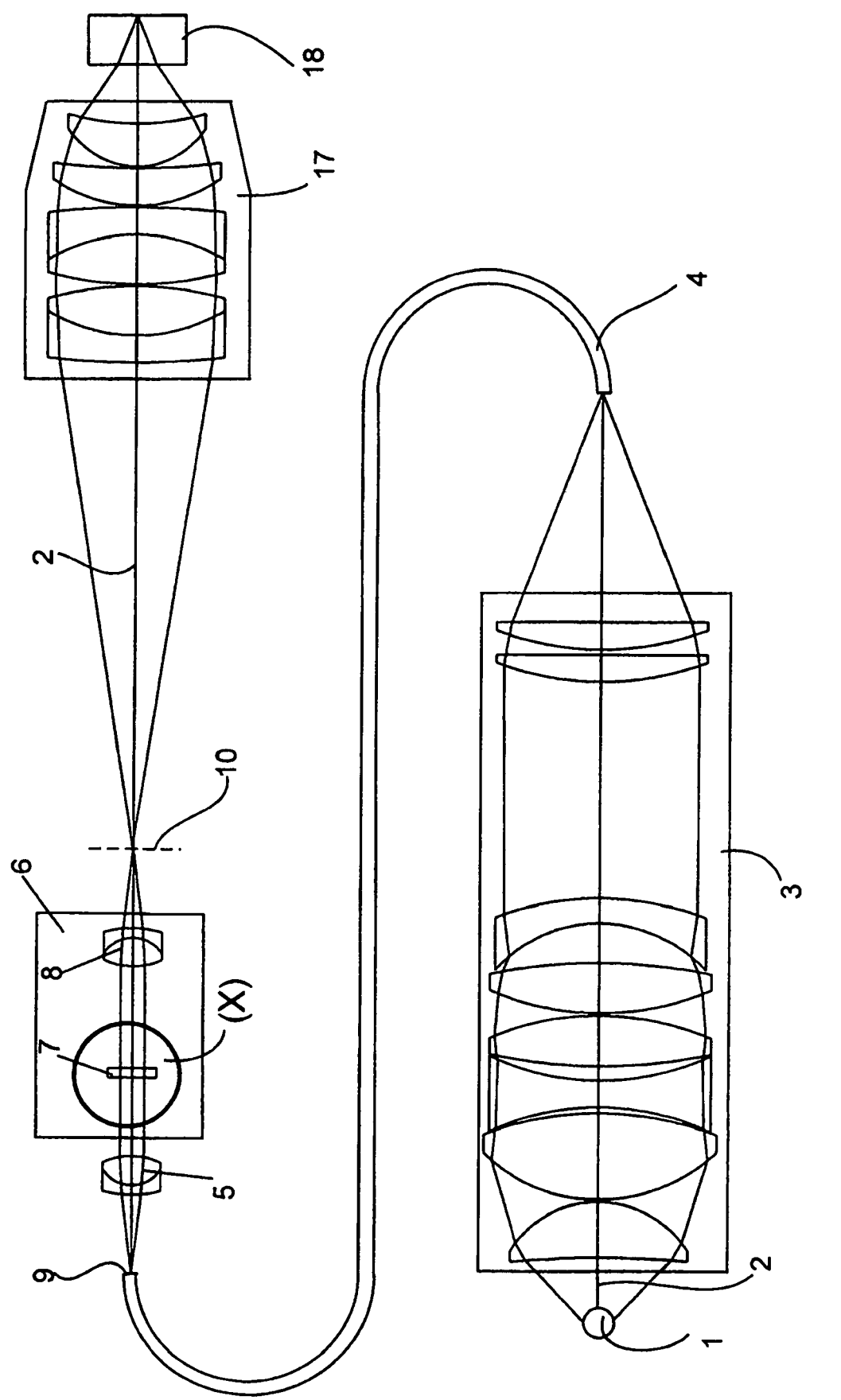
FIG. 1 shows the optical diagram of an illumination device for a transmitted-light illumination system.

FIG. 1 shows the optical diagram of an illumination device according to the present invention, in this case specifically for a transmitted-light illumination system such as can be used, for example, in a coordinate measuring instrument or a stepper.

A transmitted-light illuminating beam path having an optical axis 2 proceeds from a light source 1. The light of light source 1 is picked off via an enlarging coupling-in optical system 3 having the largest possible numerical entrance aperture (e.g. NA=0.60) and coupled into an optical waveguide. An optical fiber bundle 4 is used as the optical waveguide.

A coupling-out optical system 5, which preferably is configured as an achromat, collimates the light emitted from fiber bundle 4, the inhomogeneous intensity distribution of the light emitted from fiber bundle 4 being retained. As it exits from coupling-out optical system 5 the collimated light is therefore, according to the present invention, directed onto a homogenizing optical system 6 which transforms the inhomogeneous intensity distribution into a so-called "flat-top" (or "super-Gaussian") distribution.

Homogenizing optical system 6 comprises, in this exemplary embodiment, a micro-honeycomb condenser 7 and a lens member 8 which superimpose exit opening 9 of fiber bundle 4 in an intermediate image plane 10 to form a homogeneous intermediate image.

Figure 2:
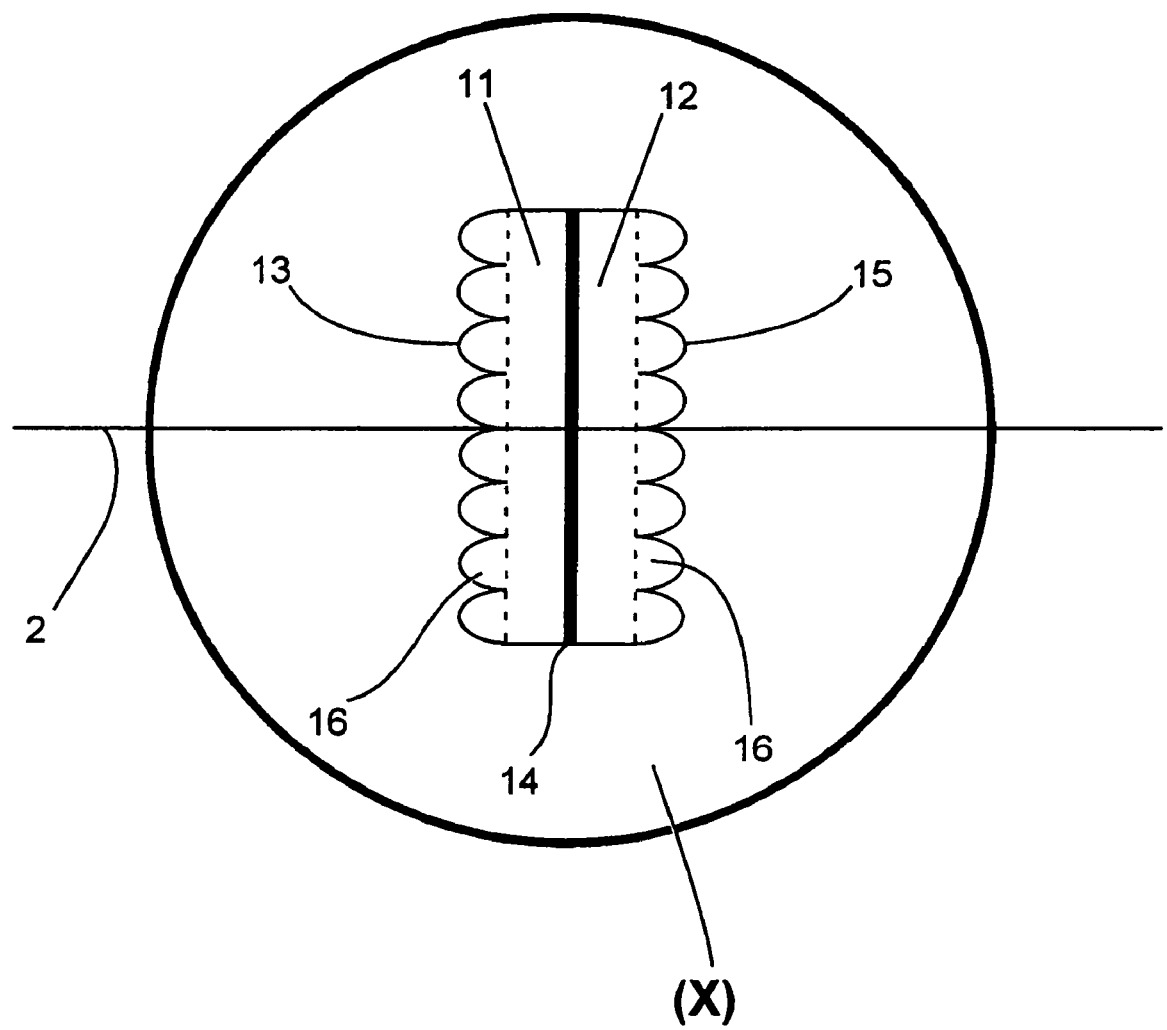
FIG. 2 shows an enlargement of detail "X" of FIG. 1, i.e. a section through a honeycomb condenser.

FIG. 2 shows a detailed enlargement of the region labeled "X" in FIG. 1, depicting a section through a micro-honeycomb condenser 7. The front external surface 11 of micro-honeycomb condenser 7 (at left in FIG. 1) is located in the focal plane of coupling-out optical system 5.

Micro-honeycomb condenser 7 comprises a first planar quartz plate 11 and a second planar quartz plate 12 that are cemented to one another. Cemented surface 14 between first quartz plate 11 and second quartz plate 12 is depicted as being disproportionately thick.

External surface 13 of first quartz plate 11 constitutes the front side of micro-honeycomb condenser 7, onto which the light coming from coupling-out optical system 5 is incident. External surface 15 of second quartz plate 12 constitutes the rear side of micro-honeycomb condenser 7, through which the light emerges again.

Planoconvex microlenses positive lenses) 16 are etched in a hexagonal arrangement into external surface 13 of first quartz plate 11 and external surface 15 of second quartz plate 12. The etching can be accomplished, for example, with a lithographic process. The two external surfaces 13 and 15 are reciprocally located at the respective focus of microlenses 16 arranged on the respectively opposite external surface 13, 15.

The result is that multiple images of exit opening 9 of fiber bundle 4 are obtained on the rear surface of micro-honeycomb condenser 7. The number of multiple images corresponds to the number of transilluminated microlenses 16. The size of the multiple images is determined by the focal length ratio of achromat 5 and the focal lengths of microlenses 16.

FIG. 1 shows the continuation of the beam path. Lens member 8, which preferably is configured as an achromat, then images the cross sections of microlenses 16 on front external surface 13 of micro-honeycomb condenser 7 into an intermediate image plane 10 in superimposed fashion. If a sufficiently large number of microlenses 16 was selected, this superimposition ensures a very homogeneous intermediate image.

The homogenized intermediate image is then, using a condenser 17 that is arranged as an illuminating optical system 17, imaged at reduced size onto a transmitted-light specimen 18. At the same time, the exit surface of micro-honeycomb condenser 16 is imaged at infinity by condenser 17. The desired homogeneous illumination of the specimen field on transmitted-light specimen 18 is thereby obtained. Transmitted-light specimen 18 can be, for example, the measurement field of a coordinate measuring instrument, or a preparation on a microscope stage.

Figure 3:
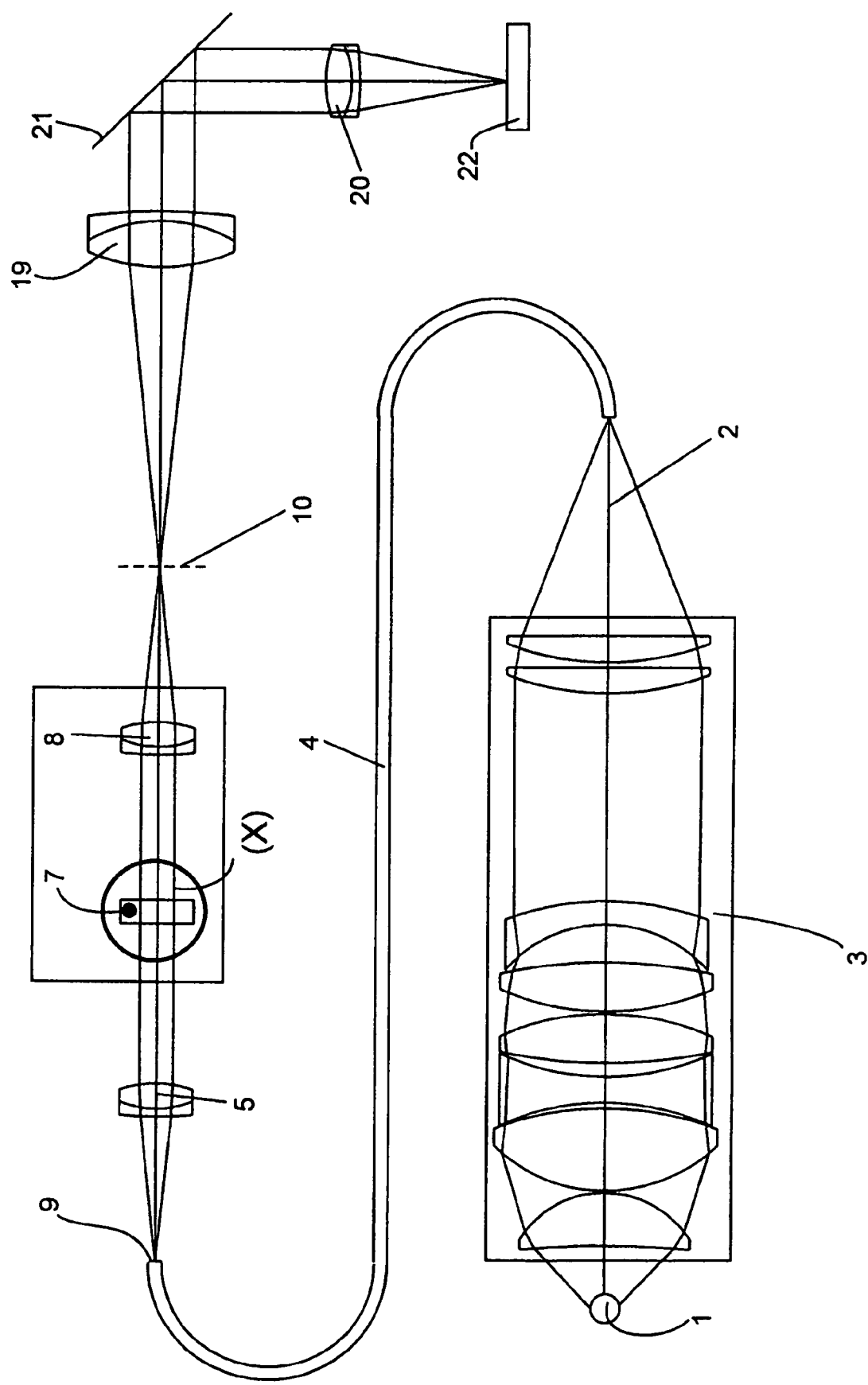
FIG. 3 shows the optical diagram of an illumination device for an incident-light illumination system.

FIG. 3 shows the optical diagram of an illumination device according to the present invention, in this case specifically for an incident-light illumination system such as can be used, for example, in a coordinate measuring instrument or a stepper.

An incident-light illuminating beam path having an optical axis 2 proceeds from a light source 1. The light of light source 1 is picked off via an enlarging coupling-in optical system 3 having the largest possible numerical entrance aperture (e.g. NA=0.60) and coupled into an optical waveguide. An optical fiber bundle 4 is used as the optical waveguide.

The light emitted from fiber bundle 4 is first collimated using a coupling-out optical system 5 which preferably is configured as an achromat. The inhomogeneous intensity distribution of the light emitted from fiber bundle 4 is retained. As it exits from coupling-out optical system 5 the collimated light is therefore, according to the present invention, directed onto a micro-honeycomb condenser 7 that is part of a homogenizing optical system 6 which transforms the inhomogeneous intensity distribution into a so-called "flat-top" (or "super-Gaussian") distribution.

As already described, multiple images of the light source (i.e., in the present case, exit opening 9 of fiber bundle 4) are obtained on the rear surface of micro-honeycomb condenser 7. The number of multiple images corresponds to the number of transilluminated microlenses 16.

A lens member 8, which preferably is configured as an achromat, then images the cross sections of microlenses 16 on front external surface 13 of micro-honeycomb condenser 7 into an intermediate image plane 10 in superimposed fashion. If a sufficiently large number of microlenses 16 was selected, this superimposition ensures a homogeneous intermediate image.

The homogenized intermediate image is then imaged at reduced size onto an incident-light specimen 22 using a lens group 19 and an objective 20 arranged as an illuminating optical system, between which a beam splitter 21 is arranged; and the rear side of micro-honeycomb condenser 15, functioning as a pupil, is imaged at infinity in the specimen space. The desired homogeneous illumination of the specimen field on incident-light specimen 22 is thereby obtained. Incident-light specimen 22 can be, for example, a measurement field of a coordinate measuring instrument, or a preparation on a microscope stage.

Figure 4:
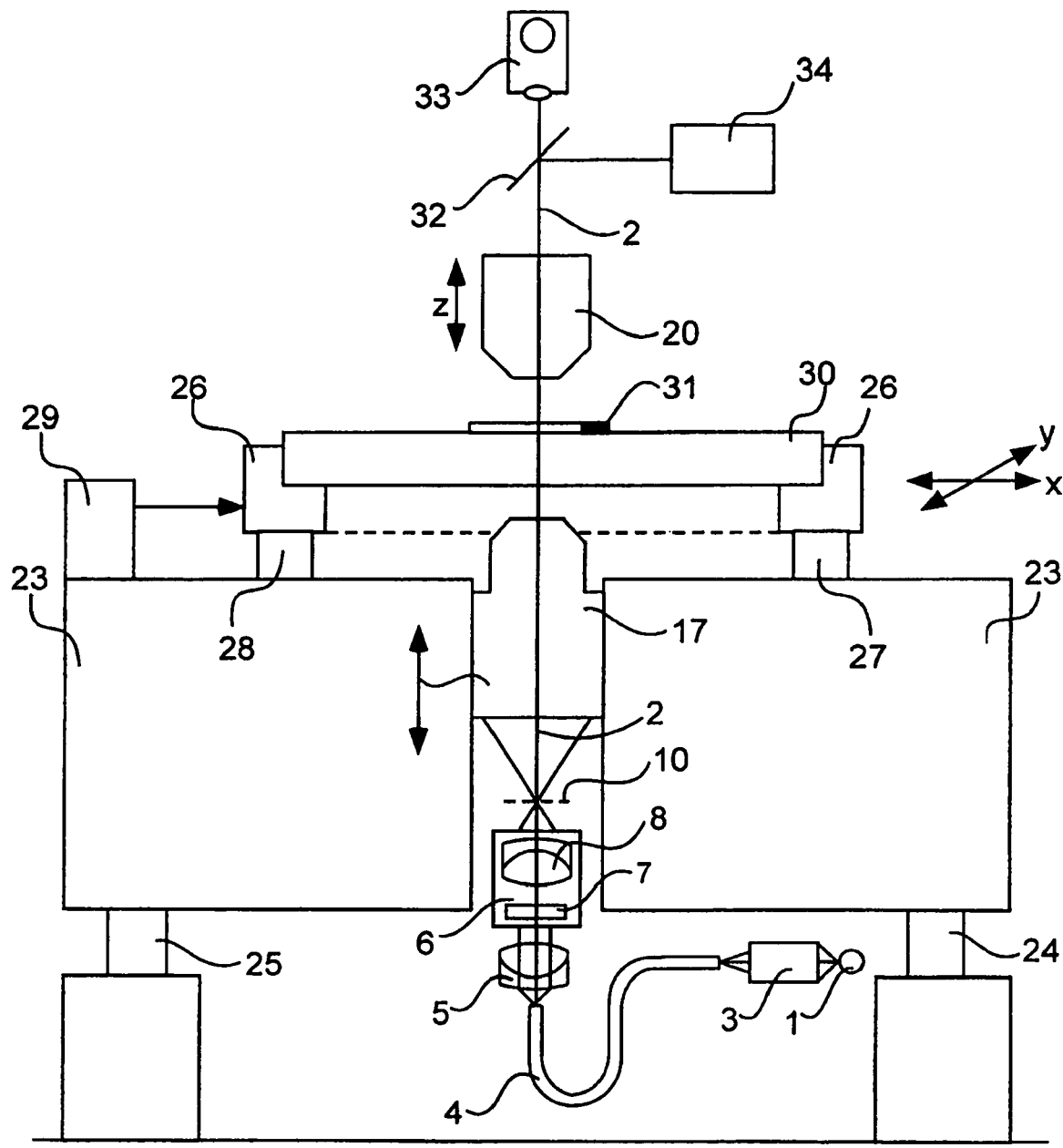
FIG. 4 shows a coordinating measuring instrument having a combined incident-light and transmitted-light illumination system which comprises a transmitted-light illumination device according to the present invention.

FIG. 4 shows an exemplary embodiment of a coordinate measuring instrument having a combined incident-light and transmitted-light illumination system which comprises a transmitted-light illumination device according to the present invention.

The coordinate measuring instrument that is depicted has a granite block 23 that is mounted on vibration dampers 24, 25. A measurement stage 26, configured as a frame, is slidingly displaceable on granite block 23 in the X and Y directions (indicated in the drawing by two arrows) on air bearings 27, 28. The frame of measurement stage 26 is advantageously made of a glass ceramic having a low coefficient of thermal expansion. The drive elements for moving measurement stage 26 are not depicted. The position of measurement stage 26 is measured in the X and Y directions with a laser interferometer system 29.

A mask 30 is set into the frame of measurement stage 26. Mask 30 is made, for example, of quartz glass. Features 31 are applied on the mask surface. Since measurement stage 26 is configured as a frame, mask 30 can also be transilluminated from below.

Located above mask 30, as the imaging system, is an objective 20 of high optical quality that is adjustable in the Z direction along its optical axis 2 for focusing. By way of a splitter mirror 32, on the one hand the light of an incident-light light source 33 is introduced into the optical beam path, and on the other hand the imaging rays are directed onto a detector device 34. Detector device 34 is, for example, a CCD camera with a high-resolution pixel array. Incident-light light source 33 emits, for example, in the near UV spectral region. By means of detector device 34, the position of a feature 31 is determined as coordinates on mask 30.

A transmitted-light illumination device having an adjustable-height condenser 17 and a light source 1 is set into granite block 23 as a further illumination device. A transmitted-light illuminating beam path having an optical axis 2 proceeds from light source 1. The light of light source 1 is picked off via an enlarging coupling-in optical system 3 having the largest possible numerical entrance aperture (e.g.

NA=0.60). A particularly large amount of light of the light source is picked off in this fashion, but the light exhibits particularly large intensity inhomogeneities over this large aperture. The picked-off light is coupled into an optical waveguide using coupling-in optical system 3. An optical fiber bundle 4 is used as the optical waveguide.

A coupling-out optical system 5, which preferably is configured as an achromat, collimates the light emitted from fiber bundle 4. The inhomogeneous intensity distribution of the light emitted from fiber bundle 4 is retained. As it exits from coupling-out optical system 5 the collimated light is therefore, according to the present invention, directed onto a homogenizing optical system 6 which transforms the inhomogeneous intensity distribution into a so-called "flat-top" (or "super-Gaussian") distribution.

In this exemplary embodiment, homogenizing optical system 6 comprises a micro-honeycomb condenser 7 and a lens member 8 which superimpose exit opening 9 of fiber bundle 4 in an intermediate image plane 10 to form a homogeneous intermediate image. With this embodiment of the homogenizing optical system, even severe intensity differences that occur as a result of the large numerical aperture of the coupling-in optical system can be very effectively homogenized. The residual illumination homogeneity is only less than ±2% of the average between the maximum intensity and minimum intensity. This results in a definite improvement in the measurement accuracy of the coordinates of features 31, especially with large masks 30.

The optical axis of condenser 17 aligns with optical axis 2 of objective 20. Adjusting the height of condenser 17 serves to adapt the illuminating rays to be directed onto feature 31 to different optical thicknesses of masks 30. In particular, the condenser head can extend into the open part of the measurement stage frame. For protection against damage in the context of displacements of measurement stage 36 over the entire mask surface, however, condenser 17 can also be pulled below the surface of granite block 23. Light sources 1 and 33 can be switched on independently of one another.

Figure 5:
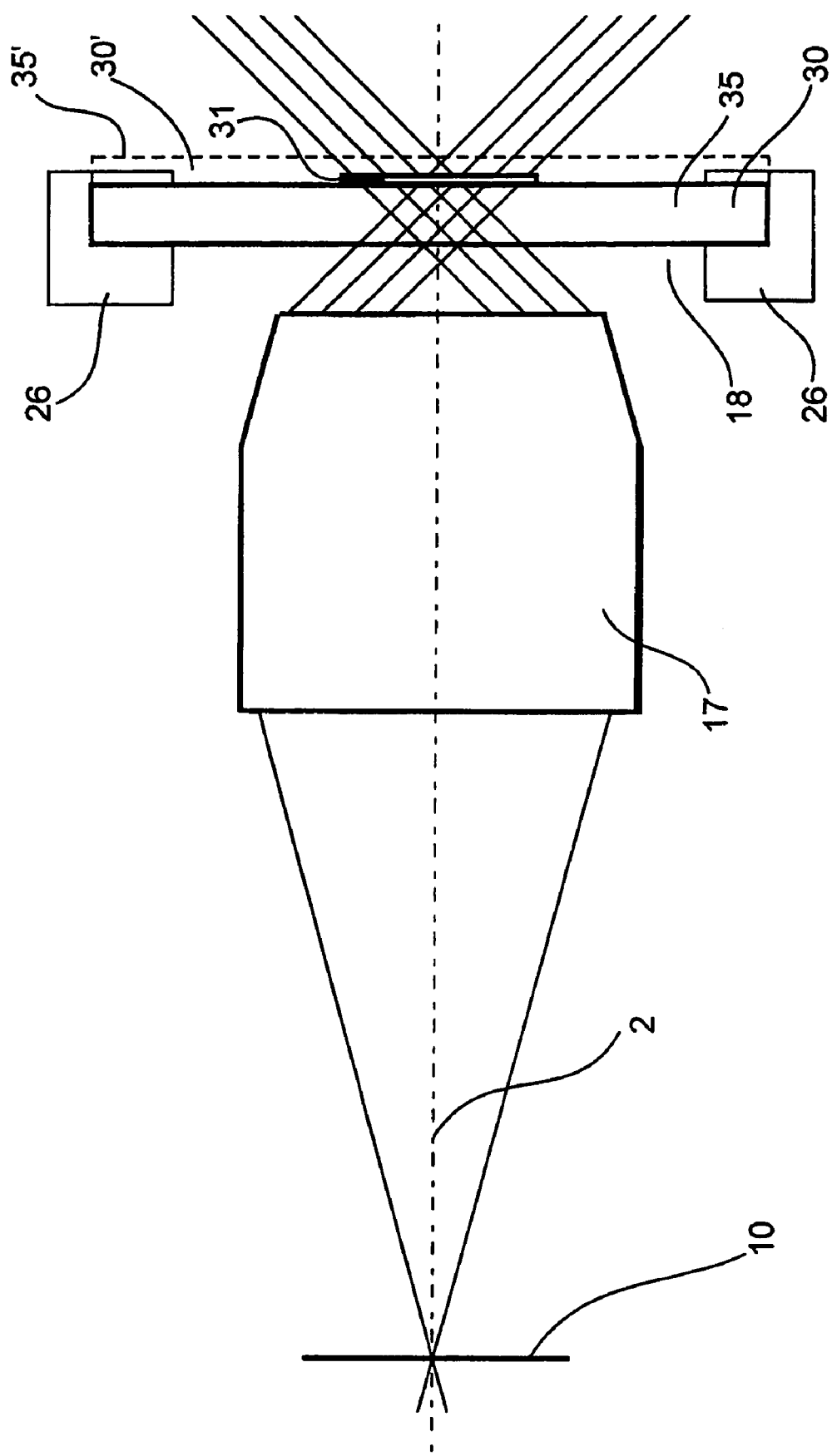
FIG. 5 shows a schematic beam path before and after the condenser of the transmitted-light illumination device of FIG. 4, for masks of different thicknesses.

FIG. 5 shows the schematic beam path before and after the condenser of the transmitted-light illumination system of the coordinate measunng instrument, in particular for masks of different thicknesses. Condenser 17 with an optical axis 2 is shown. Intermediate image plane 10 is indicated for orientation.

Condenser 17 is moved in close to a mask 30 that is mounted on the open frame of a measurement stage 26. Mask 30 has features 31 on upper side 35 facing away from condenser 17. This upper side 35 of mask 30 is illuminated with a specific image field having a very homogeneous light intensity. The homogeneously illuminated image field has, for example, a minimum diameter of 0.35 mm at a numerical aperture of 0.60.

Also indicated, with dashed lines, is a thicker mask 30' having an upper side 35'. Its upper side 35' is considerably farther away from the condenser. Since the illumination device achieves very large homogeneous image fields, even with the thicker mask 30' the image field is still sufficient for a measurement for the position of upper side 35' which determines the location of the feature planes. As a result, there is no need for refocusing due to changes in the position of the feature planes which occur as a consequence of production-related thickness tolerances of the masks.

The present invention was described with reference to exemplary embodiments. It is nevertheless apparent to any person skilled in this art that changes and modifications can be made without thereby leaving the range of protection of the claims recited hereinafter. In particular, the illumination device according to the present invention can be used for any type of measurement or inspection system, microscopes, steppers, etc.

PARTS LIST

1 Light source
2 Optical axis
3 Coupling-in optical system
4 Optical fiber bundle
5 Coupling-out optical system
6 Homogenizing optical system
7 Micro-honeycomb condenser
8 Lens member
9 Exit opening of fiber bundle 4
10 Intermediate image plane
11 First quartz plate
12 Second quartz plate
13 Front external surface of micro-honeycomb condenser 6
14 Cemented surface
15 Rear external surface of micro-honeycomb condenser 6
16 Microlenses
17 Condenser
18 Transmitted-light specimen
19 Lens group
20 Objective
21 Beam splitter
22 Incident-light specimen
23 Granite block
24 Vibration damper
25 Vibration damper
26 Measurement stage
27 Air bearing
28 Air bearing
29 Laser interferometer
30 Mask
31 Feature
32 Splitter mirror
33 Incident-light light source
34 Detector device
35 Upper side of mask

What is claimed is:

1. An illumination device comprising:
   a light source;
   an optical fiber bundle;
   a coupling-in optical system which couples the light of said light source into a first end of said fiber bundle, wherein the coupling-in optical system has a large numerical entrance aperture;
   a coupling-out optical system which couples out the light emerging from each fiber of the optical fiber bundle at a second end of said optical fiber bundle, the light emerging from the fibers retaining an inhomogeneous intensity distribution of light corresponding to the inhomogeneous distribution created at the entry of the light into the fibers at the first end of the optical fiber bundle;
   an illuminating optical system which illuminates an image field; and
   a homogenizing optical system which is arranged between said coupling-out optical system and said illuminating optical system,
   wherein said homogenizing optical system homogenizes a nonuniform intensity distribution in the image field of the light emerging from said optical fiber bundle, and wherein homogenization occurs only in an intermediate image plane, and this homogenization is performed only by the homogenizing optical system.

2. An illumination device comprising:
a light source;
an optical fiber bundle;
a coupling-in optical system which couples the light of said light source into a first end of said fiber bundle, wherein the coupling-in optical system has a large numerical entrance aperture NA that is greater than or equal to 0.60;
a coupling-out optical system which couples out the light emerging from each fiber of the optical fiber bundle at a second end of said optical fiber bundle, the light emerging from the fibers retaining an inhomogeneous intensity distribution of light corresponding to the inhomogeneous distribution created upon entry of the light into the fibers at the first end of the optical fiber bundle;
an illuminating optical system which illuminates an image field; and
a homogenizing optical system which is arranged between said coupling-out optical system and said illuminating optical system,
wherein said homogenizing optical system homogenizes the nonuniform intensity distribution in the image field of the light emerging from said optical fiber bundle, and wherein homogenization occurs only in an intermediate image plane, and this homogenization is performed only by the homogenizing optical system.

3. A coordinate measuring instrument comprising:
a horizontally X-Y displaceable measurement stage for receiving a substrate with a feature that is to be measured;
an illumination system including
a light source,
an optical fiber bundle,
a coupling-in optical system before the optical fiber bundle,
a coupling-out optical system after the optical fiber bundle,
an illuminating optical system for illuminating an image field, and
a homogenizing optical system which is arranged between said coupling-out optical system and said illuminating optical system, said homogenizing optical system homogenizes the non-uniform intensity distribution in the image field of the light emerging from the optical fiber bundle, wherein the light of said light source is picked off via said coupling-in optical system with a large numerical entrance aperture, and is coupled into said optical fiber bundle; and
a detector device for determining the coordinates of the feature within the X-Y displaceable measurement stage.

4. The coordinate measuring instrument of claim 3, wherein the feature is an edge.

5. A coordinate measuring instrument comprising:
a horizontally X-Y displaceable measurement stage for receiving a substrate with a feature that is to be measured;
an illumination system including
a light source,
an optical fiber bundle,
a coupling-in optical system before the optical fiber bundle,
a coupling-out optical system after the optical fiber bundle,
an illuminating optical system for illuminating an image field, and
a homogenizing optical system which is arranged between said coupling-out optical system and said illuminating optical system, said homogenizing optical system homogenizes the nonuniform intensity distribution in the image field of the light emerging from the optical fiber bundle, wherein the light of said light source is picked off via said coupling-in optical system with a large numerical entrance aperture NA that is greater than or equal to 0.60, and is coupled into said optical fiber bundle; and
a detector device for determining the coordinates of the feature within the X-Y displaceable measurement stage.

6. The coordinate measuring instrument of claim 5, wherein the feature is an edge.

* * * * *